United States Patent
Tokuhira et al.

(10) Patent No.: US 7,610,678 B2
(45) Date of Patent: Nov. 3, 2009

(54) HEAT TRANSFER SHEET, HEAT TRANSFER STRUCTURAL BODY AND MANUFACTURING METHOD OF THE HEAT TRANSFER STRUCTURAL BODY

(75) Inventors: Hideshi Tokuhira, Kawasaki (JP); Hiroaki Date, Kawasaki (JP); Hiroki Uchida, Kawasaki (JP); Minoru Ishinabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/012,147

(22) Filed: Dec. 16, 2004

(65) Prior Publication Data

US 2006/0037741 A1    Feb. 23, 2006

(30) Foreign Application Priority Data

Aug. 19, 2004    (JP) ............................. 2004-239960

(51) Int. Cl.
*B21D 53/02* (2006.01)
*H05K 7/20* (2006.01)

(52) U.S. Cl. .................... 29/890.03; 165/146; 165/185; 165/905; 361/704

(58) Field of Classification Search ................ 165/146, 165/185, 905; 361/704; 29/890.03
See application file for complete search history.

(56) References Cited

U.S. PATENT DOCUMENTS

| | | | | |
|---|---|---|---|---|
| 4,654,754 A | * | 3/1987 | Daszkowski | 165/185 |
| 5,649,593 A | * | 7/1997 | Yamaguchi et al. | 165/185 |
| 5,660,917 A | * | 8/1997 | Fujimori et al. | 165/185 |
| 5,781,412 A | * | 7/1998 | de Sorgo | 361/704 |
| 6,380,622 B1 | * | 4/2002 | Hirai et al. | 257/712 |
| 6,403,201 B1 | * | 6/2002 | Otagiri et al. | 428/210 |
| 6,432,497 B2 | * | 8/2002 | Bunyan | 428/40.1 |
| 6,821,625 B2 | * | 11/2004 | Chu et al. | 361/704 |

(Continued)

FOREIGN PATENT DOCUMENTS

JP    58-169912    10/1983

(Continued)

OTHER PUBLICATIONS

Office Action from Japan Patent Office regarding Application No. 2004-239960 dated Aug. 7, 2007, with English Translation and Certification and Prior Art Information List.

(Continued)

*Primary Examiner*—Leonard R Leo
(74) *Attorney, Agent, or Firm*—Arent Fox LLP

(57) ABSTRACT

A pattern is formed with an insulative resin on a bonding face of a silicon chip, which is a heat generating element, and a pattern is formed with the insulative resin on a bonding face of a heat sink, which is a heat dissipating element, in alignment with the insulative resin parts formed on the silicon chip. The silicon chip and the heat sink are bonded to each other via a heat transfer sheet. The silicon chip and the heat sink are bonded to each other by a metal to form metal connection portions in a region where no insulative resin parts are formed, while the silicon ship and the heat sink are bonded to each other by a resin to form resin connection portions in a region where the insulative resin parts are formed.

17 Claims, 8 Drawing Sheets

U.S. PATENT DOCUMENTS

| | | | |
|---|---|---|---|
| 6,896,045 B2 * | 5/2005 | Panek | 165/185 |
| 2003/0044631 A1 * | 3/2003 | Sagal et al. | 428/548 |
| 2003/0127727 A1 | 7/2003 | Suehiro et al. | |
| 2003/0150604 A1 * | 8/2003 | Koning et al. | 165/185 |

FOREIGN PATENT DOCUMENTS

| | | |
|---|---|---|
| JP | 5-209157 | 8/1993 |
| JP | 7-312493 | 11/1995 |
| JP | 09-045827 | 2/1997 |
| JP | 09-246439 | 9/1997 |
| JP | 2002-299534 | 10/2002 |
| JP | 2003-023127 (A) | 1/2003 |
| JP | 2003-051573 | 2/2003 |
| JP | 2003-176414 A | 6/2003 |
| JP | 2003-218296 A | 7/2003 |
| JP | 2003-234444 | 8/2003 |
| JP | 2003-234586 A | 8/2003 |

OTHER PUBLICATIONS

Office Action from Japan Patent Office regarding Application No. 2004-239960 dated Aug. 7, 2007 with English Translation.

* cited by examiner

HEAT TRANSFER SHEET, HEAT TRANSFER STRUCTURAL BODY AND MANUFACTURING METHOD OF THE HEAT TRANSFER STRUCTURAL BODY

CROSS-REFERENCE TO RELATED APPLICATION

This nonprovisional application claims priority under 35 U.S.C. §119(a) on Patent Application No. 2004-239960 filed in Japan on Aug. 19, 2004, the entire contents of which are hereby incorporated by reference.

BACKGROUND OF THE INVENTION

The invention relates to: a heat transfer sheet provided between a heat generating element such as a semiconductor device and a heat dissipating element such as a heat sink or a heat spreader to thereby transfer heat from the heat generating element to the heat dissipating element; a heat transfer structural body comprising the heat transfer sheet, the heat generating element and the heat dissipating element; and a manufacturing method of the heat transfer structural body.

Since considerably much heat is generated from a semiconductor device in recent years due to progress to higher speed in operation and higher complexity in integration, a necessity has arisen for efficient dissipation of generated heat to the outside. Conventionally, there has been generally employed a method of transferring heat generated in a semiconductor device to a heat sink, followed by dissipation thereof. In this method, a technique is adopted in which a heat transfer sheet made of a material with a thermal conductivity is bonded between a semiconductor device (heat generating element) and a heat sink (heat dissipating element) to reduce heat resistance in a bonding interface and to thereby improve a heat dissipation characteristic (for example, Japanese Patent Application Laid-Open 58-169912 (1983) and Japanese Patent Application Laid-Open 2003-51573(2003).

As a thermally conductive material used in heat transfer sheet, there has been well known a material obtained by dispersing an inorganic filler into a silicone resin, but with a problem of a low thermal conductivity. In addition, another thermally conductive material that has also been used is an electrically conductive paste obtained by dispersing a metal powder high in thermal conductivity such as Ag or Cu powder into an adhesive. However, since heat is transferred by point contacts between powders thereof, it is impossible to obtain a sufficiently high thermal conductivity.

On the other hand, a metal material such as solder has been used as still another thermally conductive material. A heat transfer sheet made of a metal material such as solder can exert an excellent thermal conductivity because of being a metal material, whereas heating is necessary in the bonding, which leads to a problem of degrading reliability of a bonded portion between a semiconductor device (heat generating element) and a heat sink (heat dissipating element) due to a thermal stress.

Temperature is not uniform in a recent semiconductor device with generation of much heat and a CPU core of a semiconductor device 31 is, as shown in FIG. 1, especially high in temperature as compared with the other portions, which arises a heat spot (high temperature region) 1a. A heat dissipation process is particularly important to deal with such a heat spot 1a, in which a high thermal conduction characteristic is required.

BRIEF SUMMARY OF THE INVENTION

The invention has been made in light of such circumstances and it is an object of the invention to provide: a heat transfer sheet capable of exerting a high thermal conduction characteristic to thereby realize an excellent heat dissipation characteristic without degrading reliability of a bonded portion; a heat transfer structural body comprising the heat transfer sheet, a heat generating element and a heat dissipating element; and a manufacturing method of the heat transfer structural body.

It is another object of the invention to provide: a heat transfer sheet capable of selectively exerting a high thermal conduction characteristic in a high temperature region of a heat generating element to thereby suppress a local rise in temperature; a heat transfer structural body comprising the heat transfer sheet, a heat generating element and a heat dissipating element; and a manufacturing method of the heat transfer structural body.

According to a first aspect of the invention, a heat transfer sheet, which is provided between a heat generating element and a heat dissipating element to transfer heat from the heat generating element to the heat dissipating element, contains a metal and a resin, and has plural regions having respective metal contents different from one another.

According to a second aspect of the invention, in the heat transfer sheet according to the first aspect, shapes of the plural regions are the same as those of a heat spot region and regions other than the heat spot region.

According to a third aspect of the invention, a transfer structural body comprises a heat generating element, a heat dissipating element, and a heat transfer sheet provided between the heat generating element and the heat dissipating element to thereby transfer heat from the heat generating element to the heat dissipating element, wherein the heat transfer sheet contains a metal and a resin, and has plural regions having respective metal contents different from one another.

According to a fourth aspect of the invention, in the heat transfer structural body according to the third aspect, the heat generating element has plural regions having respective temperatures different from one another, and a region of the heat generating element having a higher temperature corresponds to a region of the heat transfer sheet having a higher metal content.

According to a fifth aspect of the invention, in the heat transfer structural body according to the third aspect, the heat generating element has plural regions having respective temperatures different from one another, and a region of the heat generating element having a lower temperature corresponds to a region of the heat transfer sheet having a lower metal content.

According to a sixth aspect of the invention, a manufacturing method of a heat transfer structural body comprising a heat generating element, a heat dissipating element, and a heat transfer sheet bonded between the heat generating element and the heat dissipating element to thereby transfer heat from the heat generating element to the heat dissipating element, comprises the steps of: forming patterns with an insulative resin on respective bonding surfaces of the heat generating element and the heat dissipating element; applying a mixed material of a metal and a resin onto the respective bonding surfaces of the heat generating element and/or the heat dissipating element on which the pattern has been formed with the insulative resin; and aligning the patterned insulative resin formed on the heat generating element with the corresponding patterned insulative resin formed on the heat dissipating element to thereby heat-bond the heat generating element, the mixed material and the heat dissipating element.

In the invention, a thermally conductive material containing a metal and a resin is employed, and metal connection portions and resin connection portions are formed to thereby relax a thermal stress that has been problematic in metal bonding. For example, to be detailed, employed is a thermally conductive material obtained by dispersing a metal filler high in thermal conduction characteristic and a low melting point filler having a melting point 200° C. or less into a thermosetting resin. The low melting filler is melted by heating in the bonding to thereby connect between the metal fillers to form metal connection portions high in thermal conductivity. Subsequently, the remaining resin is cured to form resin connection portions. Since the heat transfer sheet is, in such a way, constituted of the metal connection portions and the resin connection portions, a thermal stress that has been problematic in metal bonding such as solder bonding can be relaxed by the resin connection portions. As a result, a heat transfer structural body can be obtained that is good in reliability of connection and excellent in a heat dissipation characteristic.

In the invention, patterns previously are formed with an insulative resin on a heat generating element and a heat dissipating element; therefore, in a case where a thermally conductive material containing a metal and a resin is used, metal connection portions are formed on exposed areas of surfaces of the heat generating element and the heat dissipating element where no insulative resin is present because of being wetted by the melted metal, while resin connection portions are formed on unexposed areas of the heat generating element and the heat dissipating element where the insulative resin is present because of not being wetted by the melted metal. Hence, metal connection portions and resin connection portions can be formed at desired positions according to the patterns formed with the insulative resin. Therefore, by forming metal connection portions in the region of a heat spot showing a high temperature in a heat generating element without forming insulative resin parts in advance, a high thermal conduction characteristic can be exerted to thereby improve a heat dissipation characteristic, which makes it possible to suppress a local rise in temperature.

Note that as metal fillers for use in a thermally conductive material, there can be used powder of metals good in thermal conductivity, such as Au, Ag, Cu, Sn and Al. As low melting fillers for use in a thermally conductive material, there can be used fillers of low melting metals such as alloys of Sn—Bi, In—Sn—Bi, In—Bi, In—Sn and Pb—Sn, and In. As thermosetting resins for use in a thermally conductive material, there can be used an epoxy resin, a phenol resin, a silicone resin and the like. Among these, the most preferable is an epoxy resin low in curing temperature and good in reliability. As insulative resins for use in forming patterns on a heat generating element and a heat dissipating element in advance, there can be used a polyimide resin, an epoxy resin, a phenol resin and the like. Among these, the most preferable is a polyimide resin from the viewpoint of reliability. A quantity of addition of a metal filler to a thermally conductive material is preferably 50 vol % or more. This is because a good thermal conductivity is exerted. An area coverage in percent in a pattern with the insulative resin is preferably 60% or less of the total area of a bonding surface. The reason therefor is that if exceeding 60%, a coverage fraction of the metal connection portions of the total area is low to thereby reduce thermal conduction. A heating temperature in the bonding is preferably in the range of 150° C. to 200° C.

The above and further objects and features of the invention will more fully be apparent from the following detailed description with the accompanying drawings.

DETAILED DESCRIPTION OF THE INVENTION

Figure 2:
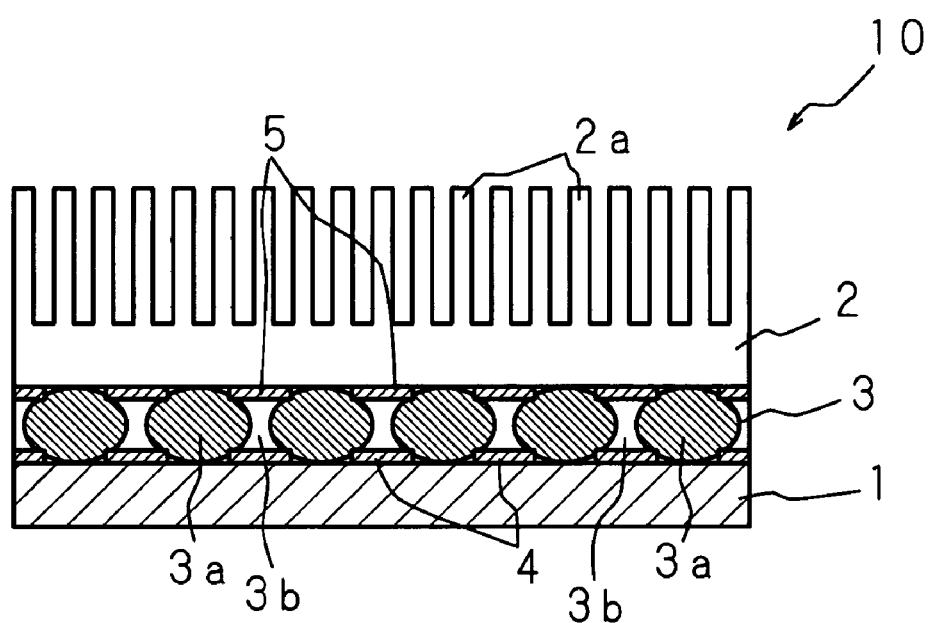
FIG. 2 is a sectional view showing a structure of a heat transfer structural body concerning the invention.

Detailed description will be given of the invention with reference to the accompanying drawings showing embodiments thereof. FIG. 2 is a sectional view showing a structure of a heat transfer structural body 10 concerning the invention.

In FIG. 2, a numerical symbol 1 indicates a silicon chip (semiconductor device) as a heat generating element (in the shape of a square with a side of 18 mm) and a pattern is formed with an insulative resin 4, which is made of a polyimide resin, on the bonding surface (the upper side surface) of the silicon chip 1. A numerical symbol 2 indicates a heat sink as a heat dissipating element having many heat dissipating fins 2a and a pattern is formed with an insulative resin 5, which is made of a polyimide resin, on the bonding surface (the lower side surface) of the heat sink 2, in alignment with the insulative resin parts 4.

The silicone chip 1 and the heat sink 2 are bonded to each other via a heat transfer sheet 3. Metal connection portions 3a are formed by bonding the silicon chip 1 and the heat sink 2 to each other by a metal in regions where neither of the insulative resin parts 4 and 5 is formed, while resin connection portions 3b are formed by bonding the silicon chip 1 and the heat sink 2 to each other by a resin in regions where the insulative resin parts 4 and 5 are formed.

Then, description will be given of a manufacturing method of a heat transfer structural body 10 with such a construction, stating actual materials. FIGS. 3A to 3E are sectional views showing steps of the manufacturing method.

Figure 3A:
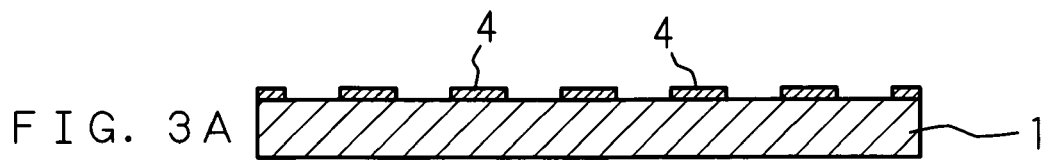
FIGS. 3A to 3E are sectional views showing steps of a heat transfer structural body manufacturing method concerning the invention.
Figure 3B:
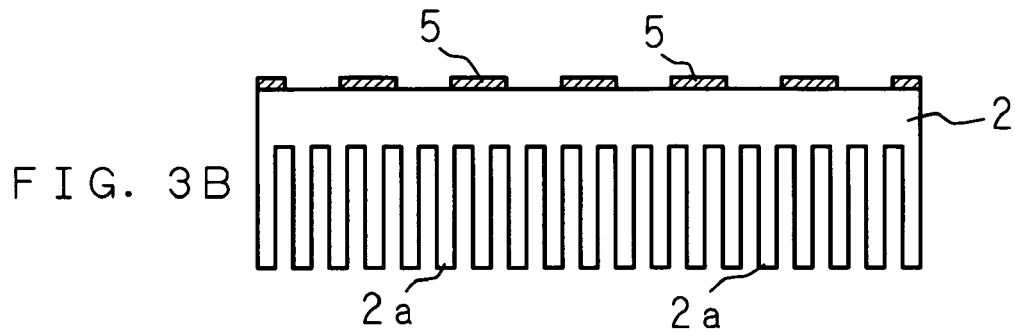

First of all, the pattern is formed as the insulative resin parts 4 on one surface (bonding surface) of the silicon chip 1 (FIG. 3A) and, also, the pattern is formed as the insulative resin parts 5 on one surface (bonding surface) of the heat sink 2 (FIG. 3B). FIGS. 4A to 4D are views showing a procedure for forming the pattern.

Figure 4A:
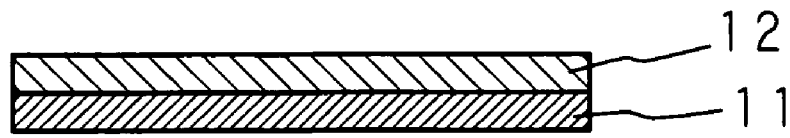
FIGS. 4A to 4D are views showing a procedure for forming a pattern using an insulative resin.

In FIGS. 4A to 4D, a numerical symbol 11, to be concrete, indicates a substrate, which is the silicon chip 1 or the heat sink 2, and a photosensitive solution having a composition described below is applied on one surface of the substrate 11 to form a photosensitive solution layer 12. Thereafter, the photosensitive solution layer 12 is prebaked in a condition at 100° C. for 1 hour (FIG. 4A).

| (Composition of the Photosensitive Solution) | |
|---|---|
| Polyimide precursor varnish: polyimide precursor | 50 parts by weight |
| Acrylic monomer: trimethylolpropane triacrylate | 10 parts by weight |
| Photoreaction initiator: benzophenone | 2 parts by weight |

Figure 4B:
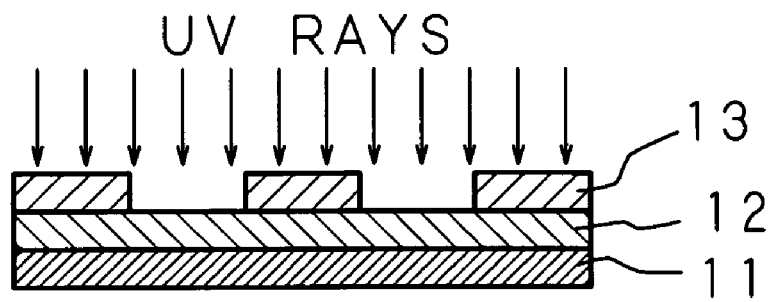
Figure 4C:
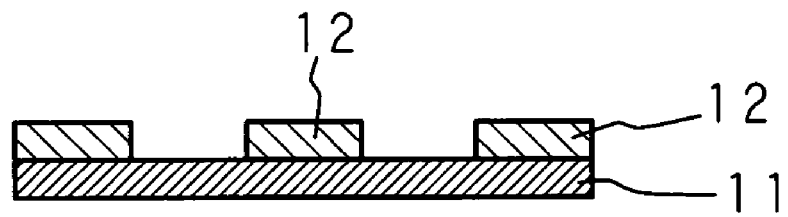
Figure 4D:
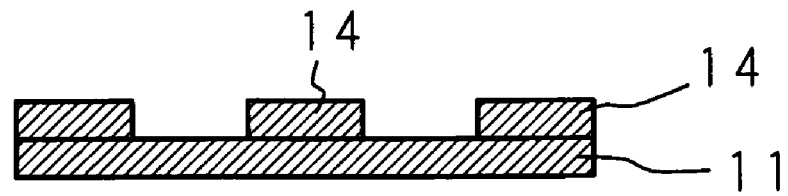

A mask 13 is placed on the prebaked photosensitive solution layer 12 and the layer is irradiated with UV rays (FIG. 4B). Then, developing and rinsing are conducted using N-methyl-2-pyrrolidone as a developing liquid and isopropyl alcohol as a rinsing liquid (FIG. 4C). Finally, the patterned resin is postbaked at 280° C. to convert the remaining polyimide precursor to a polyimide resin 14 (the insulative resin parts 4 and 5)(FIG. 4D).

Figure 3C:
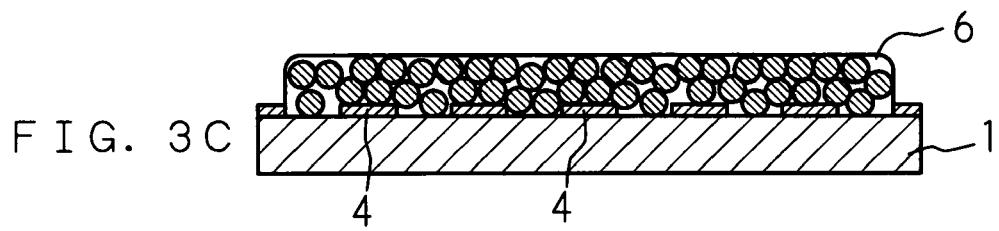

A mixed material 6 containing a metal filler and a resin (epoxy resin) with a composition described below is applied on the bonding surface of the silicon chip 1 on which the insulative resin 4 is formed as the pattern in such a way (FIG. 3C). Note that a quantity of addition of the metal filler into the resin (epoxy resin) is set to 55 vol %.

(Composition of Metal Filler)

Sn—Bi alloy (average particle diameter: 8 μm, melting point: 138° C.)

Cu (Ag plated particles, average diameter: 35 μm)

(Sn—Bi filler: Cu filler=1:1 at mixing ratio)

| (Composition of Resin (Epoxy resin)) | |
|---|---|
| Main component 1: bisphenol F type epoxy (trade name: EXA-830LVP, made by Dainippon Ink & Chemicals Inc.) | 50 parts by weight |
| Main component 2: naphthalene type epoxy (trade name: HP-4032D, made by Dainippon Ink & Chemicals Inc.) | 50 parts by weight |
| Curing agent: acid anhydride (trade name: KRM-291-5, made by Asahi Denka Co., Ltd.) | 100 parts by weight |
| Accelerator: Imidazole (trade name: 1M2EZ, made by Shikoku Corp.) | 0.1 part by weight |

Figure 3D:
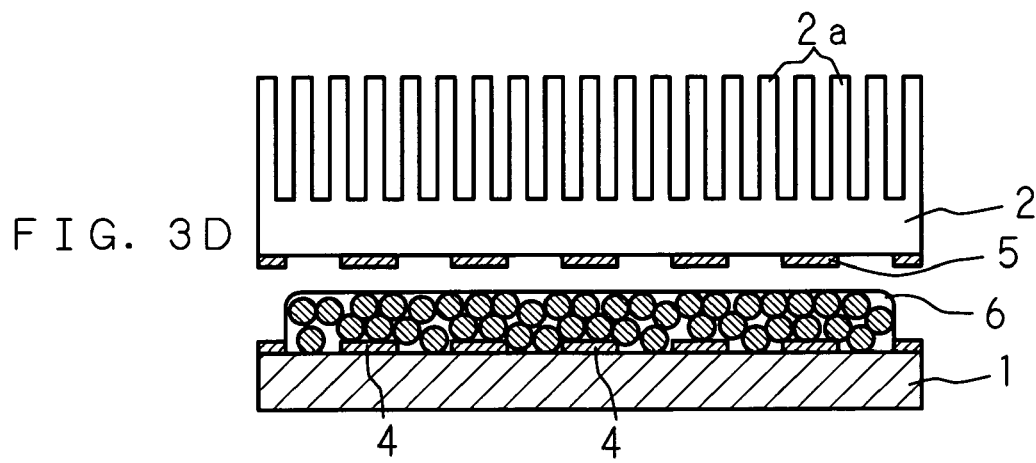
Figure 3E:
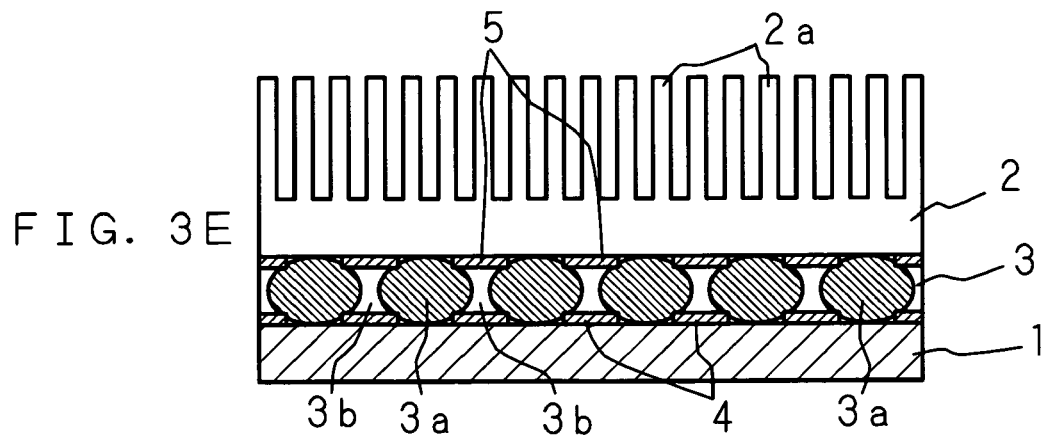

The silicon chip 1 and the heat sink 2 are superimposed so that the insulative resin parts 4 and 5 are aligned opposite each other (FIG. 3D). Thereafter, the composite is heated in condition at 150° C. for 1 hour to bond the silicon chip 1 and the heat sink 2 to each other via the mixed material 6 (FIG. 3E).

With the heat treatment applied, the heat transfer sheet 3 is obtained in a mechanism in which the Sn—Bi alloy filler is melted in the course of which metal connection portions 3a high in thermal conductivity in the state where the Cu filler is dispersed in the melted Sn—Bi alloy filler are formed in regions where neither of the insulative resin parts 4 and 5 are formed because of being wetted by the Sb—Bi alloy, while resin connection portions 3b are formed by curing the epoxy resin in regions where the insulative resin parts 4 and 5 are formed because of not being wetted by the metals. In the metal connection portion 3a, since the metal filler forms a plane contact, not a point contact thermal conductivity is high.

It is necessary that the silicon chip 1 and the heat sink 2 are good in wettability with a metal filler having a melting point of 200° C. or less. Therefore, in a case where the wettability is poor, a pretreatment, for example Au plating or the like, is preferably applied onto the silicon chip 1 and/or the heat sink 2.

In the heat transfer structural body 10 of the invention having such a construction, the heat transfer sheet 3 having the metal connection portions 3a and the resin connection portions 3b is formed between the silicon chip 1 and the heat sink 2 using the thermally conductive material containing a metal filler and a resin; therefore, a thermal stress accompanied by heating the metal can be relaxed by the resin connection portions 3b, connection between the silicon chip 1 and the heat sink 2 is good in reliability, and the heat transfer structural body 10 is also excellent in a heat dissipation characteristic due to the presence of the metal connection portions 3a high in thermal conduction characteristic.

In the heat transfer structural body 10 of the invention, position adjustment can be made in formation of the metal connection portions 3a and the resin connection portions 3b in the heat transfer sheet 3 by controlling patterns formed with the insulative resins 4 and 5. Hence, the metal connection portions 3a high in thermal conductivity can be selectively formed in alignment with a region of a heat spot of the silicon chip 1, thereby enabling a local rise in temperature to be suppressed and, in turn, efficient heat dissipation to be realized.

Then, description will be given of evaluation of a thermal characteristic on an experimental product prepared using the heat transfer structural body 10 of the invention.

Figure 5:
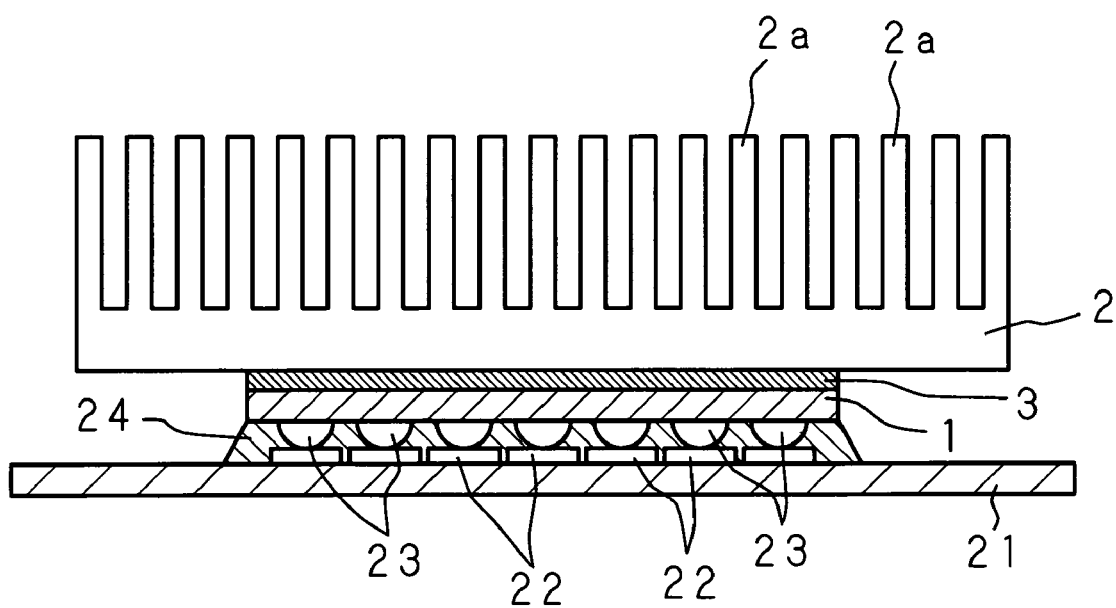
FIG. 5 is a sectional view showing a structure of an experimental product for evaluation.

FIG. 5 is a sectional view showing a structure of the experimental product for evaluation. In FIG. 5, the same numbers are attached to the same constituents as in FIG. 2. Electrodes (not shown) of the silicon chip 1 and electrodes 22 of the substrate 21 made of a resin are connected to one another via bumps 23. The connection portions are sealed with a resin 24.

The experimental products were prepared in which values of patterned resin area coverage in percent of the total bonding surface with the insulative resin 4 and 5 are set to 80%, 60%, 40%, 20% and 0% (in other words, values of patterned exposed area coverage in percent, where neither of insulative resin 4 and 5 is formed, of the total joint surface are set to 20%, 40%, 60%, 80% and 100%). Note that a metal filler or various kinds of resins used in the heat transfer sheet 3 and the insulative resin parts 4 and 5 are of the materials described above.

Resistance values to heat transfer were measured on the experimental products thus prepared with the results that good thermal characteristic values of 0.04° C.·cm$^2$/W or less were obtained on experimental products with values of patterned resin area coverage in percent with the insulative resin 4 and 5 of 60% or less (in other words, values of patterned exposed area coverage in percent where neither of insulative resin 4 and 5 is formed of 40% or more), while thermal characteristic values exceeding 0.04° C.·cm$^2$/W were obtained on experimental products with values of patterned resin area coverage in percent with the insulative resin 4 and 5 of 80% (in other words, values of patterned exposed area coverage in percent where neither of insulative resin 4 and 5 is formed of 20%).

A temperature cycle test (−25° C. to 125° C., 100 cycles) was conducted on each of the prepared experimental products to examine a thermal characteristic after the temperature cycle test. Values of resistance to heat transfer were measured on the specimen after the test with the result that thermal characteristic values of 0.04° C.·cm$^2$/W or less equivalent to those prior to the test were maintained on experimental products with values of patterned resin area coverage in percent with the insulative resin 4 and 5 of 60% or less (in other words, values of patterned exposed area coverage in percent where neither of insulative resin 4 and 5 is formed of 40% or more), while thermal characteristic values equivalent to those prior to the test were not able to be maintained on experimental products with values of patterned resin area coverage in percent with the insulative resin 4 and 5 of 80% (in other words, values of patterned exposed area coverage in percent where neither of insulative resin 4 and 5 is formed of 20%).

It was found from the above results that it is preferable that a value of patterned resin area coverage in percent of the total bonding surface with the insulative resin 4 and 5 is 60% or less (in other words, values of patterned exposed area coverage in percent of the total bonding surface where neither of insulative resin 4 and 5 is formed is set to 40% or more).

Figure 1:
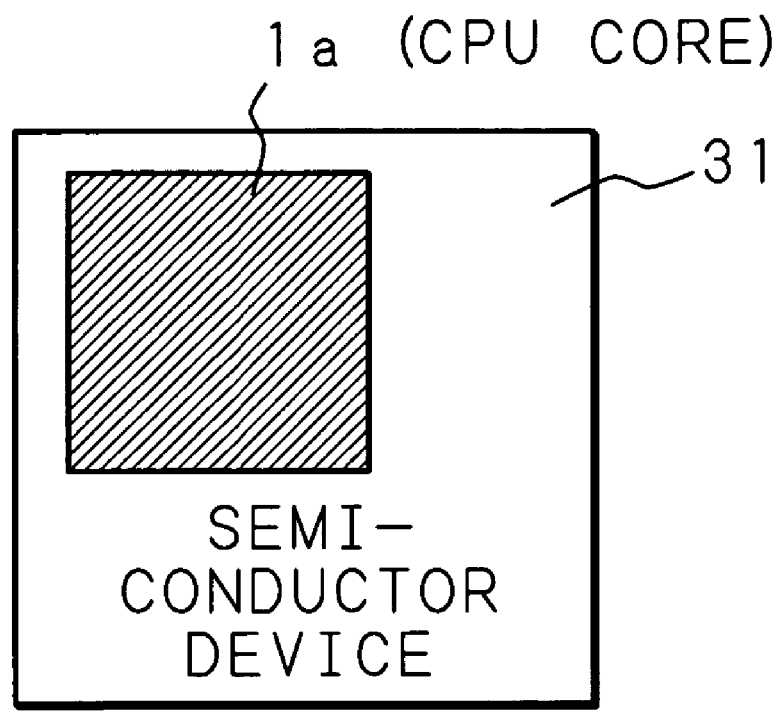
FIG. 1 is a view showing a heat spot in a semiconductor device.
Figure 6:
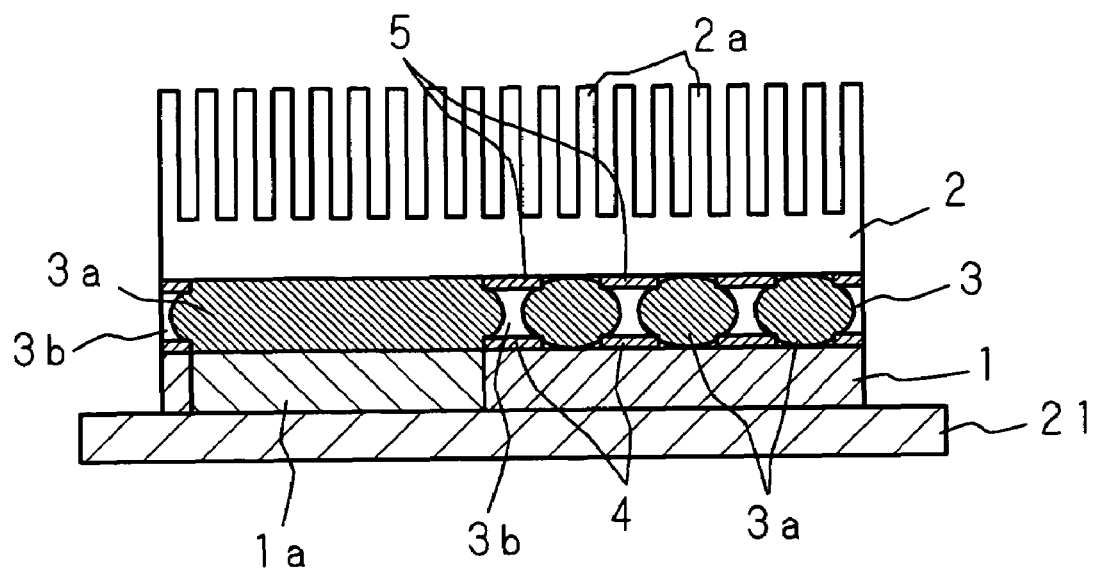
FIG. 6 is a sectional view showing a structure of an experimental product for evaluation of the invention.

FIG. 6 is a sectional view showing a structure of an experimental product for evaluation of the invention. In FIG. 6, the same numbers are attached to the same constituents as in FIG. 2. An alphanumerical symbol la indicates a heat spot (see FIG. 1) corresponding to a CPU core of a silicon chip 1 placed on a substrate 21. The heat spot 1a generates more of heat as compared with other portions to reach a high temperature. In the experimental product shown in FIG. 6, in a region corresponding to the heat spot 1a, no insulative resins 4 and 5 are formed and all of corresponding part of the heat transfer sheet 3 is made of a metal connection portion 3a, not a resin connection portion 3b.

Figure 7:
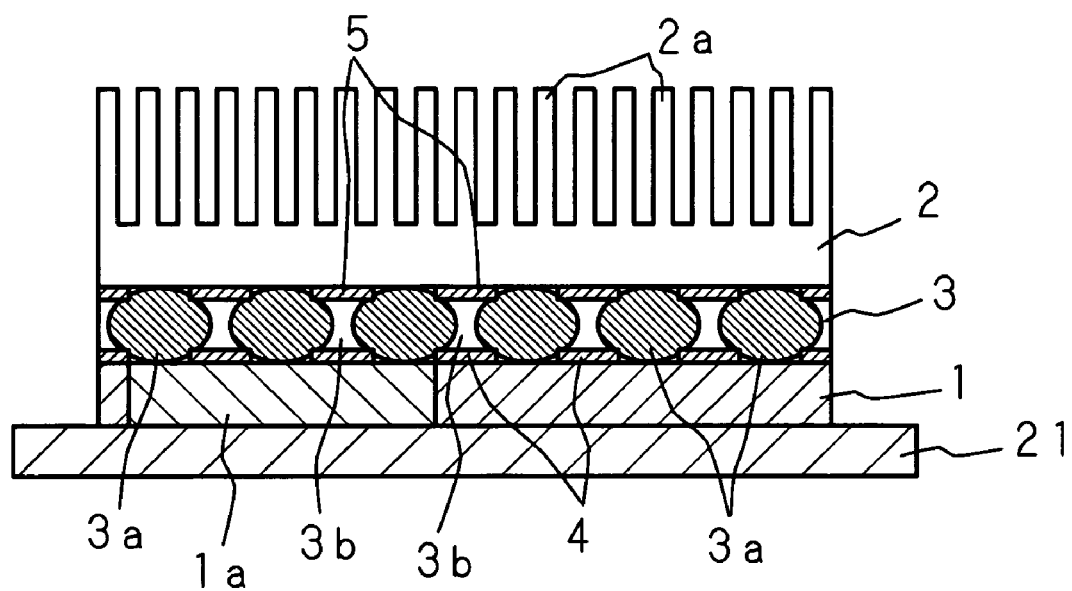
FIG. 7 is a sectional view showing a structure of an experimental product for evaluation as a comparative example.

FIG. 7 is a sectional view showing a structure of an experimental product for evaluation as a comparative example. In FIG. 7, the same numbers are attached to the same constituents as in FIG. 2. In the experimental product shown in FIG. 7, metal connection portions 3a and resin connection portions 3b are formed in disregard of the position of the heat spot 1a with resin connection portions 3b present even in the region corresponding to the heat spot 1a.

In the experimental products shown in FIGS. 6 and 7, a value of patterned resin area coverage in percent of the total bonding surface with the insulative resin 4 and 5 is set to 60% or less (in other words, values of patterned exposed area coverage in percent of the total bonding surface where neither of insulative resin 4 and 5 is formed is set to 40% or more). A metal filler and various kinds of resins used in a heat transfer sheet 3 and insulative resin parts 4 and 5 are of the materials described above.

A temperature distribution was measured in the silicon chip 1 of each of the experimental products shown in FIGS. 6 and 7. In the experimental product shown in FIG. 6, the maximum temperature spread was 3.5° C., while in the experimental product shown in FIG. 7, the maximum temperature spread was 9.3° C. It was found from the results that a small temperature spread can be realized in the silicon chip 1 by providing only a metal connection portion 3a without insulative resin 4 and 5 in the region corresponding to the heat spot 1a. That is, it was able to be confirmed that a local rise in temperature (a rise in temperature of the heat spot 1a) is suppressed by constituting all of part of the heat transfer sheet 3 corresponding to the heat spot 1a with the metal connection portion 3a, thereby enabling an effect of suppressing a temperature spread in the silicon chip 1 to be exerted.

Note that the above-described embodiment is an example of the invention and the invention is not limited to this embodiment.

Figure 8:
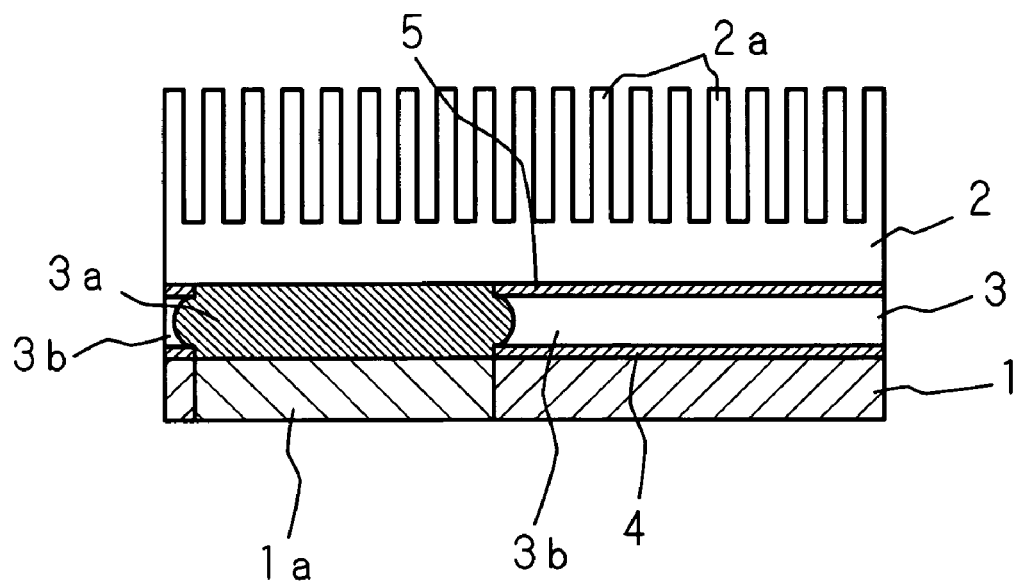
FIG. 8 is a sectional view showing another embodiment of a heat transfer structural body of the invention.

FIG. 8 is a sectional view showing another embodiment of a heat transfer structural body of the invention. In FIG. 8, the same symbols are attached to the same constituents as in FIG. 6. In a heat transfer sheet 3 of the embodiment shown in FIG. 8, the region corresponding to a heat spot 1a is a metal connection portion 3a where neither of insulative resin 4 and 5 is formed and regions other than the region corresponding to the heat spot 1a are provided with resin connection portions 3b formed on insulative resin parts 4 and 5.

While in the embodiments, a polyimide resin is used for insulative resin 4 and 5, there may be used thermosetting resins such as an epoxy resin and a phenol resin. While in the embodiments, Sn—Bi alloy is used as a metal filler with a melting point of 200° C. or less contained in the mixed material 6, there can be used at least one kind of material selected from the group consisting of Sn—Bi alloy, In—Sn—Bi alloy, In—Bi alloy, In—Sn alloy, Pb—Sn alloy and In. While in the embodiments, Cu powder particles of which are Ag plated is used as metal fillers good in thermal conductivity contained in the mixed material 6, there may be used metals such as Au, Ag, Sn and Al in addition to Cu, and in order to improve wettability with a metal filler having a melting point of 200° C. or less, there may be applied surface treatments such as Au plating and Ag plating on particles of the metal filler. While in the embodiments, an epoxy resin is used as a thermosetting resin contained in the mixed material 6, there can also be used other kinds of thermosetting resins such as a phenol resin and a silicone resin.

While in the embodiments, the mixed material 6 is applied on insulative resin parts 4 on the silicon chip 1 formed by patterning, the mixed material 6 may be applied on insulative resin parts 5 on the heat sink 2 formed by patterning and the mixed material 6 may also be applied on both of the insulative resin parts 4 and 5 on the silicon chip 1 and the heat sink 2, respectively.

In the invention, since a thermally conductive material containing a metal and a resin is employed to form metal connection portions and resin connection portions, a thermal stress that has been problematic in metal bonding can be relaxed and connection reliability is good, thereby enabling a heat transfer structural body excellent in heat dissipation characteristic to be provided.

In the invention, since metal connection portions good in thermal conductivity can be formed in a desired portion or portions in a heat transfer sheet, a local rise in temperature can be suppressed with certainty.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A heat transfer sheet provided between a heat generating element and a heat dissipating element to transfer heat from the heat generating element to the heat dissipating element, the heat transfer sheet comprising:
   insulative resin films in which patterns corresponding to each other are formed;
   resin connection portions arranged corresponding to the patterns of the insulative resin films; and
   metal connection portions provided in regions exclusive of the insulative resin films,
   wherein the heat transfer sheet has plural regions having respective metal content ratios different from one another, and the insulative resin films are located in an area free of the metal connection portions.

2. The heat transfer sheet of claim 1, wherein shapes of the plural regions are the same as those of a heat spot region and regions other than the heat spot region.

3. The heat transfer sheet of claim 1, wherein the metal connection portions include a first kind of metal having a melting point of 200° C. or less and a second kind of metal higher in thermal conductivity than the first kind of metal.

4. The heat transfer sheet of claim 3, wherein the first kind of metal is a metal selected from the group consisting of alloys of Sn—Si, In—Sn—Bi, In—Bi, In—Sn and Pb—Sn, and In.

5. The heat transfer sheet of claim 3, wherein the second kind of metal is a metal selected from the group consisting of Au, Ag, Cu, Sn and Al.

6. A heat transfer structural body comprising:
a heat generating element;
a heat dissipating element; and
a heat transfer sheet provided between the heat generating element and the heat dissipating element to transfer heat from the heat generating element to the heat dissipating element,
wherein the heat transfer sheet comprises insulative resin films in which patterns corresponding to each other are formed; resin connection portions arranged corresponding to the patterns of the insulative resin films; and metal connection portions provided in regions exclusive of the insulative resin films, and wherein the heat transfer sheet has plural regions having respective metal content ratios different from one another, and the insulative resin films are located in an area free of the metal connection portions.

7. A heat transfer structural body comprising:
a heat generating element;
a heat dissipating element; and
a heat transfer sheet provided between the heat generating element and the heat dissipating element to transfer heat from the heat generating element to the heat dissipating element,
wherein the heat transfer sheet comprises insulative resin films in which patterns corresponding to each other are formed; resin connection portions arranged corresponding to the patterns of the insulative resin films; and metal connection portions provided in regions exclusive of the insulative resin films, wherein the heat transfer sheet has plural regions having respective metal content ratios different from one another, and the insulative resin films are located in an area free of the metal connection portions, and
wherein the heat generating element has plural regions having respective temperatures different from one another, and a region of the heat generating element having a higher temperature corresponds to a region of the heat transfer sheet having a higher metal content.

8. A heat transfer structural body comprising:
a heat generating element;
a heat dissipating element; and
a heat transfer sheet provided between the heat generating element and the heat dissipating element to transfer heat from the heat generating element to the heat dissipating element,
wherein the heat transfer sheet comprises insulative resin films in which patterns corresponding to each other are formed; resin connection portions arranged corresponding to the patterns of the insulative resin films; and metal connection portions provided in regions exclusive of the insulative resin films, wherein the heat transfer sheet has plural regions having respective metal content ratios different from one another,
wherein the insulative resin films are located in an area free of the metal connection portions, and
wherein the heat generating element has plural regions having respective temperatures different from one another, and a region of the heat generating element having a lower temperature corresponds to a region of the heat transfer sheet having a lower metal content.

9. The heat transfer structural body of claim 6, wherein the metal connection portions include a first kind of metal having a melting point of 200° C. or less and a second kind of metal higher in thermal conductivity than the first kind of metal.

10. The heat transfer structural body of claim 9, wherein the first kind of metal is a metal selected from the group consisting of alloys of Sn—Bi, In—Sn—Bi, In—Bi, In—Sn and Pb—Sn, and In.

11. The heat transfer structural body of claim 9, wherein the second kind of metal is a metal selected from the group consisting of Au, Ag, Cu, Sn and Al.

12. A method for manufacturing a heat transfer structural body comprising a heat generating element, a heat dissipating element, and a heat transfer sheet bonded between the heat generating element and the heat dissipating element to thereby transfer heat from the heat generating element to the heat dissipating element, the method comprising the steps of:
forming patterns with an insulative resin on respective bonding surfaces of the heat generating element and the heat dissipating element;
applying a mixed material of a metal and a resin onto the respective bonding surfaces of the heat generating element and/or the heat dissipating element on which the pattern has been formed with the insulative resin by arranging resin connection portions corresponding to the patterns of the insulative resin; and providing metal connection portions in regions exclusive of the insulative resin; and
aligning the patterned insulative resin formed on the heat generating element with the corresponding patterned insulative resin formed on the heat dissipating element to thereby heat-bond the heat generating element, the mixed material and the heat dissipating element;
wherein said regions have respective metal content ratios different from one another, and the insulative resin are located in an area free of the metal connection portions.

13. The method of claim 12, wherein an area coverage in percent in a pattern with the insulative resin is 60% or less of the total area of each of the bonding surfaces of the heat generating element and the heat dissipating element.

14. The method of claim 12, wherein the mixed material is obtained by dispersing a metal filler having a thermal conductivity into a thermosetting resin.

15. The method of claim 14, wherein the metal filler includes a first kind of metal filler having a melting point of 200° C. or less and a second kind of metal filler higher in thermal conductivity than the first kind of metal filler.

16. The method of claim 15, wherein the first kind of metal filler is a filler of metal selected from the group consisting of alloys of Sn—Bi, In—Sn—Bi, In—Bi, In—Sn and Pb—Sn, and In.

17. The method of claim 15, wherein the second kind of metal filler is a filler of metal selected from the group consisting of Au, Ag, Cu, Sn and Al.

* * * * *